Nov. 20, 1962 F. H. MASTERSON 3,064,341

SEMICONDUCTOR DEVICES

Filed Dec. 26, 1956 2 Sheets-Sheet 1

INVENTOR

FRANK H. MASTERSON

BY

Alvin J. Riddles

AGENT

United States Patent Office 3,064,341

Patented Nov. 20, 1962

3,064,341

SEMICONDUCTOR DEVICES

Frank H. Masterson, Poughkeepsie, N.Y., assignor to International Business Machines Corporation, New York, N.Y., a corporation of New York Filed Dec. 26, 1956, Ser. No. 630,596
2 Claims. (Cl. 29—25.3)

This invention relates to semiconductor devices and in particular to the automatic fabrication of such devices as diodes and transistors in a glass encapsulated package.

It has been established in the art that a semiconductor device has longer life and is more reliable when provided with a glass hermetic seal over the parts of the device responsible for its electrical characteristics. However, heretofore to in the art, due to problems arising as a result of the small physical size and fragileness of the component parts and the intense heat, a technique of automatically fabricating a glass encapsulated semiconductor device has not been established. This invention is directed to the automatic fabrication of a glass encapsulated semiconductor device wherein all elements of the device are assembled along a common axis and automatic machine fabrication techniques may be employed to assemble the device.

A primary object of this invention is to provide a coaxial glass encapsulated semiconductor device.

Another object is to provide an automatic machine technique for fabricating a glass encapsulated semiconductor device.

Another object is to provide a coaxial glass encapsulated semiconductor diode.

Still another object is to provide an automatic machine fabrication technique for fabricating a glass encapsulated semiconductor diode.

A related object is to provide a method of forming ohmic contacts to semiconductor crystals.

Another related object is to provide a method of fusing glass through the use of an induction heater.

Still another related object is to provide an improved glass encapsulated semiconductor diode structure.

Other objects of the invention will be pointed out in the following description and claims and illustrated in the accompanying drawings, which disclose, by way of example, the principle of the invention and the best mode, which has been contemplated, of applying that principle.

Figure 1:
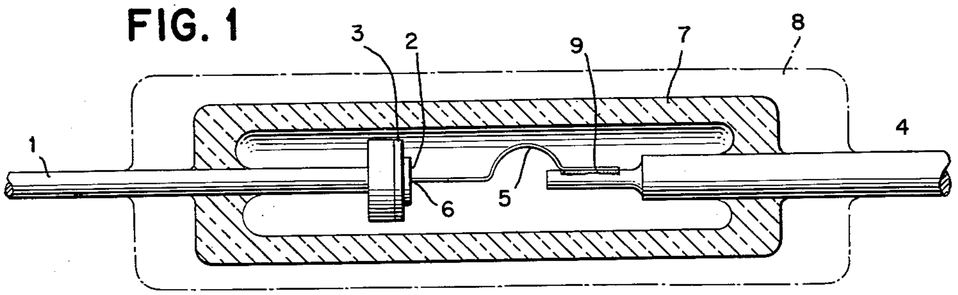
FIGURE 1 is a sectional view of a semiconductor diode illustrating the principles of this invention.

Referring now to FIGURE 1 for purposes of illustration, a glass encapsulated coaxial semiconductor diode is shown to point out the constructional features of a semiconductor device made using the technique of this invention. The diode of FIGURE 1 comprises a crystal supporting electrode 1 having a semiconductor crystal 2 ohmically bonded thereto through the use of a bonding wafer 3. A cathode electrode 4 is provided having a cathode lead 5 forming a rectifying junction 6 with the semiconductor crystal 2. Electrodes 4 and 1 are maintained in fixed relationship with respect to each other by a glass sleeve 7 which is fused to each of the electrodes 1 and 4 and forming an hermetic seal over the entire assembly. A plastic coating 8 has been shown surrounding the entire glass case for heat insulation, shock absorption and light restricting advantages that are well known in the art. The diode of FIGURE 1 is illustrative of the features of construction of the technique of this invention whereby semiconductor devices may be coaxially assembled in operations, the critical nature of which is controlled by the nature of the materials used and the structure of assembly equipment at each stage hence automatic machine fabrication techniques are facilitated by virtue of the fact that delicate hand operations are avoided and the elements comprising the assembly are mounted along a common axis so that step by step assembly techniques can be more readily performed.

Figures 2, 3:
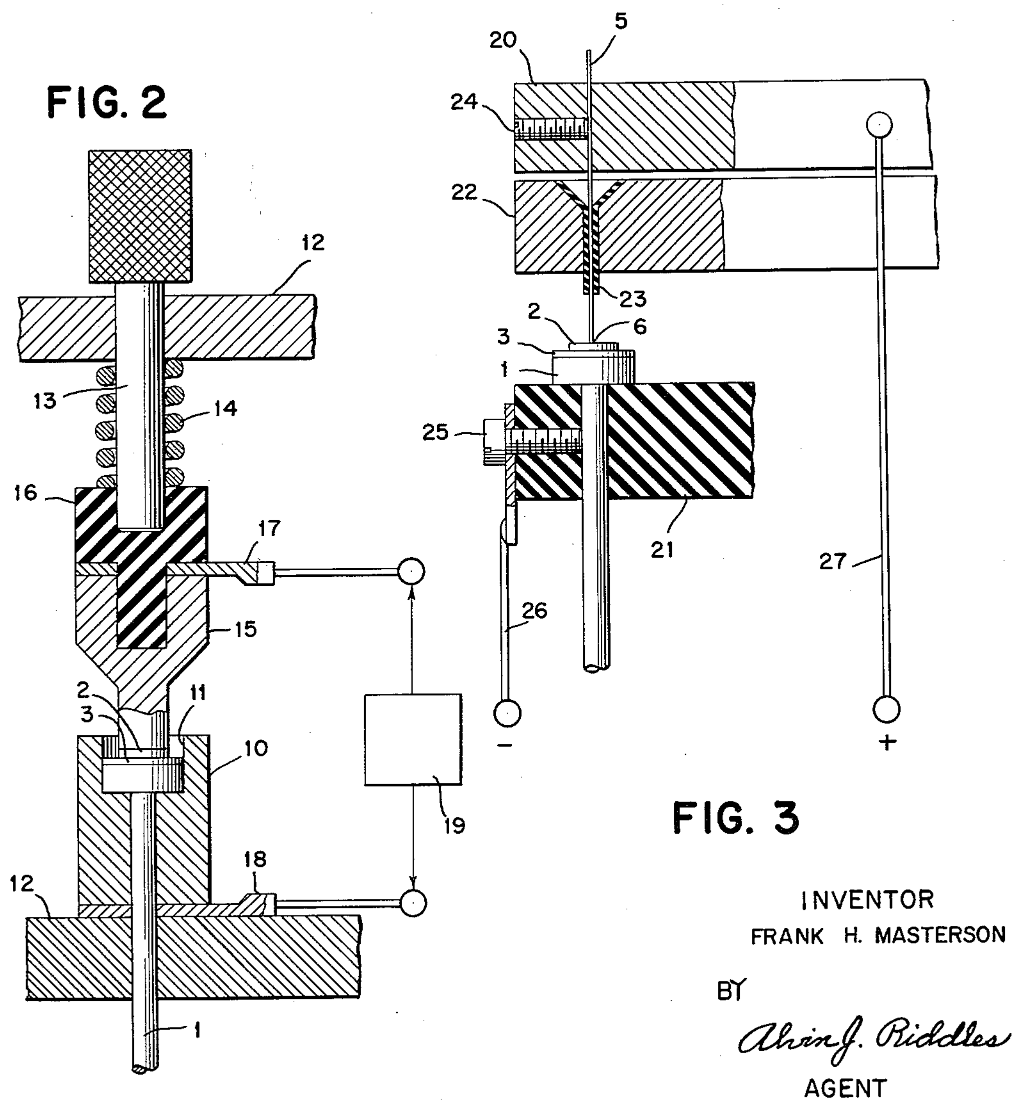
FIGURE 2 is a schematic view of an assembly fixture illustrating the method of bonding the semiconductor die to a supporting lead.
FIGURE 3 is a schematic view of an assembly fixture capable of attaching a rectifying electrode to the semiconductor crystal.

In assembling a semiconductor device such as the diode of FIGURE 1, the first step of the process is to provide an ohmic connection between the semiconductor crystal 2 and the supporting electrode 1. This is accomplished in the technique of this invention by a step analogous to resistance welding and this step is illustrated by the schematic assembly fixture shown in FIGURE 2. In the fixture of FIGURE 2 a supporting element 10 is provided to retain the supporting electrode 1, the crystal 2 and the bonding wafer 3 during the bonding operation. The supporting element 10 is shown, for purposes of manufacturing the diode being illustrated, as having a recess 11 of sufficient size and shape to accommodate and retain one end of the crystal supporting electrode 1, the crystal 2 and the bonding wafer 3 and having a hole therethrough to accommodate the remainder of the supporting electrode 1. The holder 10 is mounted on a frame 12 having a member extending above the holder such that a vertical member 13 may be so mounted as to apply downward pressure to the combination of the crystal 2 and the bonding wafer 3 and the supporting electrode 1 when mounted in the recess 11. A spring 14 is provided to cause the member 13 to apply pressure to the elements mounted in the holder 10. The purpose of the schematic fixture of FIGURE 2 is to retain the supporting lead 1, the bonding wafer 3 and the crystal 2 in electrical contact while current is passed therethrough for bonding. For this reason the member 13 is equipped with a conductive tip 15 which is insulated by an insulating spacer 16. The conductive tip 15 is equipped with an electrical connection 17 and the holder 10 is made of conductive materials and is equipped with an electrical connection 18.

In this step of the process the crystal supporting electrode 1 is first assembled into the holder 10 and for purposes of illustration, the crystal supporting electrode 1 in this case is shown as having a larger head thereon to permit positioning in the recess 11 of the holder 10. This feature of construction is shown for illustration purposes only, it being understood that so long as the crystal supporting electrode is of sufficient size to provide a good mounting for the semiconductor crystal 2, its actual size and head shape would be purely arbitrary. Further, since the holder 10 serves merely to maintain the crystal supporting electrode 1, the bonding wafer 3 and the crystal 2 in contact with each other so that current may pass in series through each, the holder 10 can be of any suitable shape to accomplish this purpose, for example, a chuck.

A bonding wafer 3 of a material capable of forming an eutectic alloy with the semiconductor crystal 2 and with the crystal supporting electrode 1 is next inserted in the recess 11 in contact with the electrode 1. The semiconductor crystal 2 is then inserted in the recess 11 in contact with the wafer 3. The conductive tip 15 is then brought to bear on the crystal and pressure is maintained by the spring 14. A source of power shown as the power supply 19 is applied between the electrical connections 17 and 18 so that current flows in a series path through the electrode 1, the wafer 3 and the crystal 2. This serves to raise the temperature of these elements to the eutectic alloy temperature of the wafer 3, semiconductor crystal 2 system, and the wafer 3, electrode 1 system. This technique is similar to the technique of resistance welding in that a series electrical path is provided between the output terminals of the power source 19, comprising the terminal 17, the tip 15, the crystal 2, the wafter 3, the electrode 1, the holder 10 and the terminal 18 and wherein the points of highest resistance in this current path are the interfaces between the crystal 2 and the wafer 3 and between the wafer 3 and electrode 1. Under such conditions, the greatest power dissipation and consequently the greatest heat generated will occur at the interfaces between the crystal 2 and the wafer 3 and between the wafer 3 and the electrode 1 and when the temperature at these points due to this power dissipation reaches the eutectic alloy temperature of the wafer 3 and semiconductor crystal 2 system and the eutectic alloy temperature for the wafer 3 and electrode system 1. These elements will fuse together at a temperature lower than the melting point of each of them and one single ohmic contact will be formed. Since it is a characteristic of an eutectic alloy that the melting temperature thereof is considerably lower than other melting points in the system, the control of temperature to make this connection is not critical. Further, such a bonding technique as is here described is of particular advantage in semiconductor devices wherein P-N junctions have been made by diffusion since the time spent at high temperatures is short, no appreciable further diffusion takes place. The pressure holding elements 1, 2 and 3 together is not critical nor are the materials from which the schemtatic fixture of FIGURE 2 is made, critical as long as the points of highest resistance in any series electrical path containing the crystal 2, the wafer 3 and the electrode 1 occur at the interfaces between the crystal 2 and the wafer 3, and between the wafer 3 and anode 1, and the power applied is sufficient to reach the highest melting eutectic alloy temperature of the systems comprising the wafer 3 and the crystal 2 and the wafer 3 and the electrode 1.

While the choice of materials and the dimensions involved in such a bonding operation as is illustrated in FIGURE 2 as above described may vary widely, the relationship of the materials of the elements 1, 2 and 3 must be such that both of the above described eutectic alloy temperatures are lower then the melting temperature of any of the elements 1, 2 or 3. The following materials and dimensions for the elements of the diode of FIGURE 1 have been included in order to provide a proper perspective and to aid in practicing and understanding the invention. It should be understood that such information is not to be construed as a limitation since it will be apparent to one skilled in the art that a wide choice of specifications are available. The electrode 1 may be made for example of one of the materials used in the art for purposes of coefficient of expansion and for glass to metal sealing such as an alloy of 51% nickel and 49% iron or an alloy of 43% nickel and 57% iron sheated in borated copper or an alloy of 29% nickel, 17% cobalt, 3% manganese and 51% iron, these alloys are known in the art as "52 Alloy," "Dumet" and "Kovar" respectively. The electrode 1 may have a diameter of .020 inch and have a shoulder on one end thereof having a diameter of .060 inch. The semiconductor crystal 2 may be made of germanium, for example of N type conductivity. The bonding wafer 3 may be made of gold being .060 inch in diameter and having a thickness of .005 inch. The conductive tip 15 may be made of carbon, platinum or tungsten and the holder 10 is made of a high melting point material such as those materials known in the art as "Kanthal" or "Nichrome." The spring 14 exerts 25 grams pressure per square centimeter and the power supply 19 supplies 13 amperes at 3 volts for a period of 15 seconds. This is believed to create a temperature of about 450° C. at the bonding faces, namely, the faces between elements 2 and 3 and between 3 and 1, and this temperature is higher than the eutectic alloy temperature of both the gold-germanium and the gold-Dumet systems.

What has been described in connection with FIGURE 2 is a technique for applying contacts to semiconductor crystals wherein the assembly operations performed are all accomplished along a single axis thereby facilitating automatic machine fabrication and the bonding accomplished is done in such a manner that the physical properties of the materials employed and the physical arrangement of the parts in the bonding operation eliminates hand assembly operations and close control of such factors as temperature. It will be apparent to one skilled in the art that by including appropriate conductivity directing impurities in the wafer 3 material electrical changes in the crystal 2 such as the formation of PN junctions may be accomplished in connection with the bonding operation.

The manner of applying small area rectifying electrodes to a semiconductor device using the technique of this invention is discussed for the diode of FIGURE 1 in connection with the schematic fixture shown in FIGURE 3.

Referring now to FIGURE 3 a schematic fixture capable of attaching a cathode wire 5 and forming a small area rectifying junction 6 with the semiconductor crystal 2 is illustrated. The fixture of FIGURE 3 comprises a head member 20 of conductive material capable of vertical motion with respect to an anvil member 21 also of conductive material. A guide member 22 is provided, mounted between the head 20 and the anvil 21 and having therethrough a positioning and supporting orifice 23 of insulating material capable of guiding a small diameter wire shown as element 5. Retaining devices shown as screws 24 and 25 respectively are provided for purposes of positioning the elements to be assembled in this operation and to insure good electrical contacts of the elements being assembled with the members to which each is attached. Terminals 26 and 27 are provided to permit the application of power from an appropriate power supply, such as element 19 in FIGURE 2, to be applied between the element 5 and the semiconductor crystal 2 so as to form a rectifying junction 6 at the point of contact of these elements.

In the formation of the rectifying connection, the subassembly formed in the previous step, namely, the crystal supporting electrode 1 ohmically bonded to the semiconductor crystal 2 through the wafer 3 is placed on the anvil 21 with a portion of the electrode 1 extending through a hole therein and a good electrical contact between the crystal 2 and the anvil 21 is insured by tightening of the screw 25. The cathode lead 5 is inserted through a hole in the head 20 and through the insulating orifice 23 until contact is made with a semiconductor crystal 2. Good electrical contact between the cathode lead 5 and the head 20 is insured through a tightening of screw 24 and vertical motion may be imparted to the cathode lead 5 sufficient to insure good bearing pressure of the cathode lead 5 on the semiconductor crystal 2 by movement of the head 20 through the anvil 21. The application of electrical power between terminals 26 and 27 flows in the current path comprising terminal 27, head 20, the cathode lead 5, the semiconductor crystal 2, the anvil 21 and the terminal 26. In this instance, the point of highest resistance is at the point of bearing of the lead 5 on the crystal 2 and the greatest temperature generated in the current path is at this point of greatest power dissipation. Hence the lead 5 when made of proper material with respect to the crystal 2, will form an eutectic alloy with the semiconductor crystal 2 when the temperature at this point reaches the eutectic temperature. In order to insure a rectifying or current multiplying contact appropriate conductivity directing impurities are included in the material from which the cathode lead 5 is drawn so that these impurities may be introduced into the crystal 2 altering the conductivity thereof when the eutectic temperature is reached.

In this particular illustration for the diode of FIGURE 1 a satisfactory material for the cathode lead 5 has been found to be a gold or platinum-ruthenium wire .002 inch in diameter containing appropriate P type conductivity directing impurities such as indium. The power to be applied between terminals 26 and 27 necessary to provide a satisfactory rectifying junction 6 is 2 amperes at 20 volts for a period of 50 milliseconds. At this point the semiconductor diode of FIGURE 1 is electrically complete so that any testing or rectifying contact improvement steps that are believed to be advantageous may be performed at this time.

Figures 4, 5:
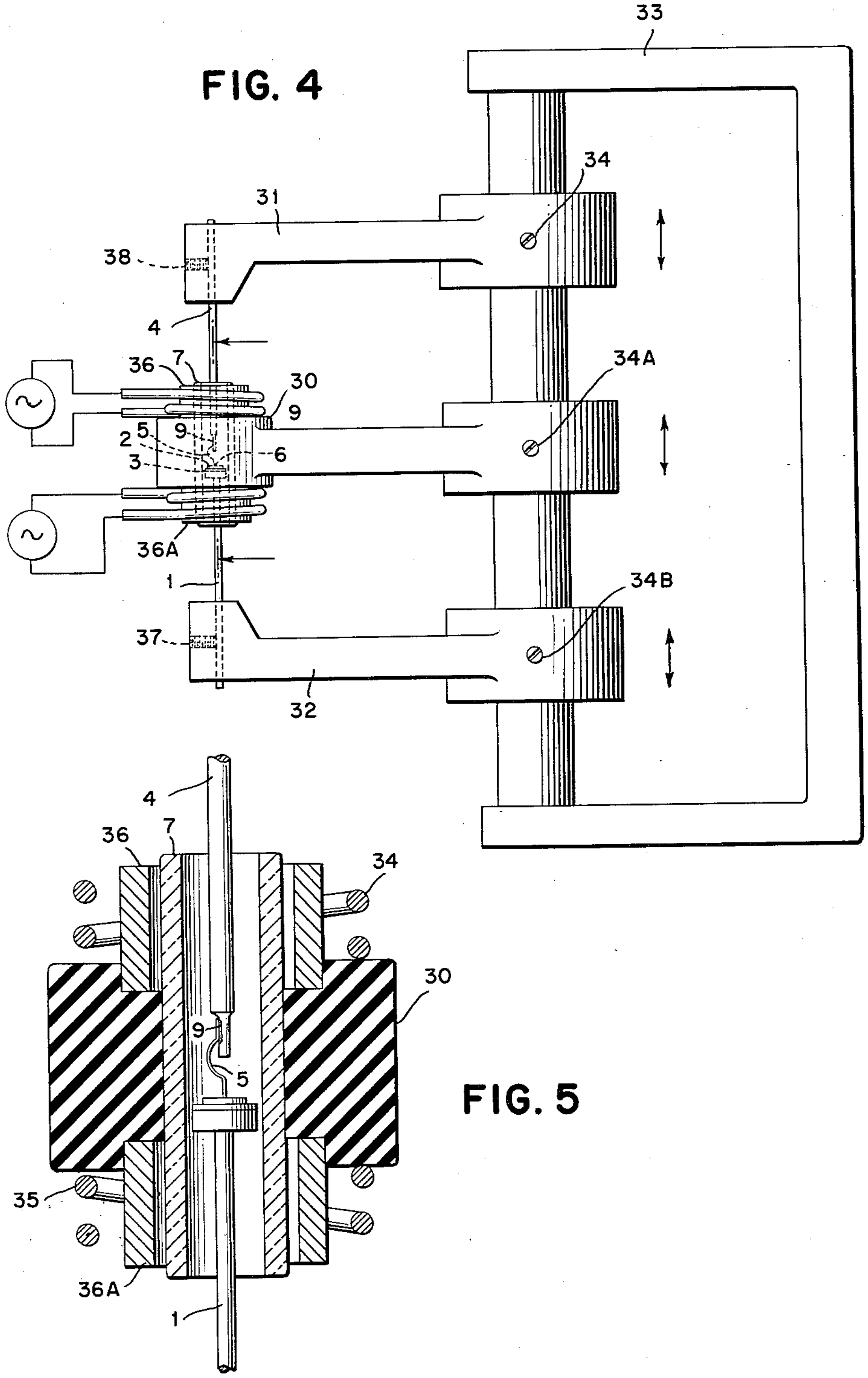
FIGURE 4 is a schematic view of an assembly fixture used in assembling a semiconductor device according to this invention.
FIGURE 5 is a sectional view along the lines X—X of the induction heater assembly and mounting holder of the fixture of FIGURE 4.

The final assembly and encapsulation operations of this invention are accomplished in connection with the schematic piece of equipment illustrated in FIGURE 4. In FIGURE 4 an assembly device is illustrated having a glass sleeve holder 30 capable of vertical motion and two electrode holders 31 and 32 each being capable of vertical motion and provided with means to maintain them in fixed relationship with respect to each other. These features are shown in FIGURE 4 by the fact that the holders 30, 31 and 32 are slidably mounted on the frame 33 and may be retained in position by screws 34, 34A and 34B. Induction heaters 35 and 35A are provided and positioned so as to be able to fuse the ends of a glass sleeve to be used as the sealing enclosure over the semiconductor device being manufactured. The holder 30 is of appropriate size to permit the ends of a glass sleeve such as the sleeve 7 of FIGURE 1 to extend beyond the holder. Induction heater inserts 36 and 36A are provided between the induction heating coils and the glass sleeve 7 for purposes to be later explained.

In this step of the process the semiconductor device, for example, the diode of FIGURE 1 is formed and glass encapsulation thereof is accomplished in the following general manner. The semiconductor diode subassembly, comprising the supporting electrode 1, the wafer 3, a semiconductor crystal 2 and the cathode lead 5, are mounted in one holder, for example, holder 32 of the assembly fixture of FIGURE 4 and appropriately secured therein by means such as a screw 37. Holder 30 is positioned over the diode subassembly as by releasing screw 34A, moving the holder 30 and retightening screw 34A. A glass sleeve 7 of appropriate dimensions for the semiconductor device being manufactured is positioned in the holder 30 with both ends exposed. The holder 30 is then moved toward holder 32 so that the sleeve 7 is positioned around the crystal supporting electrode 1 and the diode subassembly is exposed. The cathode electrode 4 is placed in the holder 31 and rigidly secured therein as by means such as a screw 38. Holder 31 is now moved in the direction of holder 32 until the cathode lead 5 comes into contact with the cathode electrode 4.

Referring now to FIGURE 5 an enlarged cross sectional view of the assembly is shown wherein the cathode electrode 4 is shown in contact with cathode lead 5 and appropriate spot welding equipment, not shown, is used to form a spot weld 9 between the electrode 4 and the lead 5. The technique of spot welding is well known in the art and the equipment for its practice is readily available. Any equipment capable of causing sufficient electric power to be dissipated at the point of contact of the elements 4 and 5 will cause the melting necessary for spot welding. For purposes of illustration, a shoulder has been shown on the electrode 4, to facilitate positioning, this feature is arbitrary and as long as an electrically low resistance and high mechanical stability spot weld between the lead 5 and the electrode 4 is acquired, the shoulder, while helpful due to the small physical size of the elements, is not necessary. Referring again to FIGURE 4, once the spot weld 9 has been made, the holders 31 and 32 are moved toward each other a small distance. This is illustrated as a bend in the lead 5. The function of the movement of electrodes 1 and 4 toward each other is to compensate for a difference in coefficient of expansion between the glass sleeve 7 and the elements making up the remainder of the assembly. The holder 30 is now moved in the direction of element 31 until the glass sleeve 7 surrounds and the ends are positioned equally distant from the semiconductor diode assembly. The induction heaters 35 and 35A then are energized to cause the glass of the sleeve 7 to fuse and form an hermetic seal with the leads 1 and 4.

Referring again to FIGURE 5, in this larger view, the elements 36 and 36*a* are shown inserted between coils of the induction heaters 35 and 35A and the glass sleeve 7. The elements 36 and 36A are made of electrically conductive, high melting temperature materials which serve the function of radiating heat until the conductive temperature of glass has been reached. Glass has been found to be a conductor and susceptible to induction heating, when the temperature of the glass reaches 900° C. and above, but glass is not a conductor until this temperature is reached. For this purpose, elements 36 and 36A of conductive material are inserted inside the coils 34 and 35 to become heated as a result of the inductive energy applied thereto and to radiate such heat to the glass sleeve 7 until the conductive temperature of glass is reached, at which time elements 36 and 36A may be removed if desired. As a result of this, it is possible to use induction heating to fuse the glass and thereby to avoid the corrosive effects and difficult temperature control associated with the use of flame, as a source of heat. Upon the completion of the fusing step the semiconductor diode is as shown in FIGURE 1 may be provided with an insulating coating 8 having the heat insulating, shock resisting and light retarding advantages well known in the art. The coating 8 may be applied by an appropriate dipping or spraying technique.

What has been described is a technique of fabrication of semiconductor devices whereby all assembly operations are performed along a common axis and each assembly operation is performed in such a manner that the physical properties of the elements being assembled and the general structural principles of the fixture in which the elements are assembled cooperate to avoid delicate hand operations and extremely close control requirements and a method of employing induction heating to a normally illustrated nonconductive material is utilized. The technique has been illustrated in connection with the fabrication of a semiconductor diode although as will be apparent to one skilled in the art the principles of the technique are applicable to semiconductor devices other than diodes. The assembly fixtures described have been limited in structural detail so as to illustrate only the features of construction necessary for explanation and for the practice of the invention.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

What is claimed is:

1. A method of providing contacts to a glass encapsulated semiconductor device along a common axis comprising in combination the steps of providing a supporting electrode having a surface perpendicular to a selected axis, placing a wafer of metal capable of forming an eutectic alloy with said supporting electrode in contact with said surface of said supporting electrode, placing a first surface of a semiconductor crystal having first and second essentially parallel surfaces in contact with said wafer, said semiconductor crystal being of a material capable of forming an eutectic alloy with said wafer, passing sufficient electric current through the combination of said crystal, said wafer and said electrode to fuse said crystal to said wafer and said wafer so said supporting electrode, positioning a rectifying electrode capable of forming an eutectic alloy with said crystal and containing appropriate semiconductor conductivity directing impurities in contact with said second surface of said crystal passing sufficient electric current through the combination of said rectifying electrode and said crystal to fuse said rectifying electrode to said crystal and to form a rectifying contact therewith, positioning an external electrode wire with the longitudinal dimension thereof parallel to said selected axis adjacent to said rectifying electrode and spaced from said crystal, fusing said rectifying electrode to said external electrode to effect a fully assembled electrode structure, positioning a glass sleeve around said crystal with a first open end thereof adjacent to a portion of said supporting electrode and a second open end thereof adjacent to a portion of said external electrode and fusing said open ends of said glass sleeve to the portions of said electrodes passing therethrough in a manner such that said crystal is uneffected by said fusing.

2. A method of providing contacts to a glass encapsulated semiconductor device according to claim 1 wherein said fusing of said open ends of said glass sleeve to said portions of said electrodes passing therethrough is accomplished by inductive heating.

References Cited in the file of this patent

UNITED STATES PATENTS

| | | |
|---|---|---|
| 2,432,491 | Thomas | Dec. 9, 1947 |
| 2,583,163 | Wasserman | Jan. 22, 1952 |
| 2,633,489 | Kinman | Mar. 31, 1953 |
| 2,697,805 | Collins | Dec. 21, 1954 |
| 2,699,594 | Bowne | Jan. 18, 1955 |
| 2,765,516 | Haegele | Oct. 9, 1956 |
| 2,793,332 | Alexander et al. | May 21, 1957 |
| 2,796,563 | Ebers et al. | June 18, 1957 |
| 2,832,016 | Bakalar | Apr. 22, 1958 |
| 2,847,624 | Goldman | Aug. 12, 1958 |

UNITED STATES PATENT OFFICE

CERTIFICATE OF CORRECTION

Patent No. 3,064,341 November 20, 1962

Frank H. Masterson

It is hereby certified that error appears in the above numbered patent requiring correction and that the said Letters Patent should read as corrected below.

In the drawings, Sheet 2, FIG. 5, for the reference numerals "34" read -- 35 --, and "35" read -- 35A --; column 6, line 16, for "36a" read -- 36A --; lines 26 and 27, for "34 and 35" read -- 35 and 35A --; line 50, strike out "illustrated"; column 7, line 7, for "so" read -- to --.

Signed and sealed this 22nd day of October 1963.

(SEAL)
Attest:

ERNEST W. SWIDER
Attesting Officer

EDWIN L. REYNOLDS
Acting Commissioner of Patents